(12) United States Patent
Kogure

(10) Patent No.: US 11,102,881 B2
(45) Date of Patent: Aug. 24, 2021

(54) FLAT HARNESS

(71) Applicant: YAZAKI CORPORATION, Tokyo (JP)

(72) Inventor: Naoto Kogure, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/878,559

(22) Filed: May 19, 2020

(65) Prior Publication Data

US 2020/0404776 A1 Dec. 24, 2020

(30) Foreign Application Priority Data

Jun. 20, 2019 (JP) .............................. JP2019-114882

(51) Int. Cl.
*H05K 1/02* (2006.01)

(52) U.S. Cl.
CPC . *H05K 1/0266* (2013.01); *H05K 2201/09936* (2013.01)

(58) Field of Classification Search
CPC ....... H05K 1/0266; H05K 2201/09936; H05K 1/02

USPC ........................................................ 174/250

See application file for complete search history.

(56) References Cited

U.S. PATENT DOCUMENTS

| 4,636,017 A | 1/1987 | Boteler |
| 2016/0190087 A1* | 6/2016 | Yu .......................... H01L 24/75 |
| | | 156/379.6 |

FOREIGN PATENT DOCUMENTS

| JP | 5-242746 A | 9/1993 |
| JP | 6-23123 U | 3/1994 |
| JP | 7-176216 A | 7/1995 |
| JP | H11-27817 A | 1/1999 |
| JP | 2001-216846 A | 8/2001 |
| JP | 2002-56722 A | 2/2002 |

* cited by examiner

*Primary Examiner* — Tremesha S Willis
(74) *Attorney, Agent, or Firm* — Kenealy Vaidya LLP

(57) ABSTRACT

A flat harness includes a plurality of flat circuit bodies that are stacked to each other. A mark is provided on a side surface of each of the plurality of flat circuit bodies. A position of the mark in a length direction of the flat circuit body is provided so as to be different for each type of the flat circuit body.

8 Claims, 6 Drawing Sheets

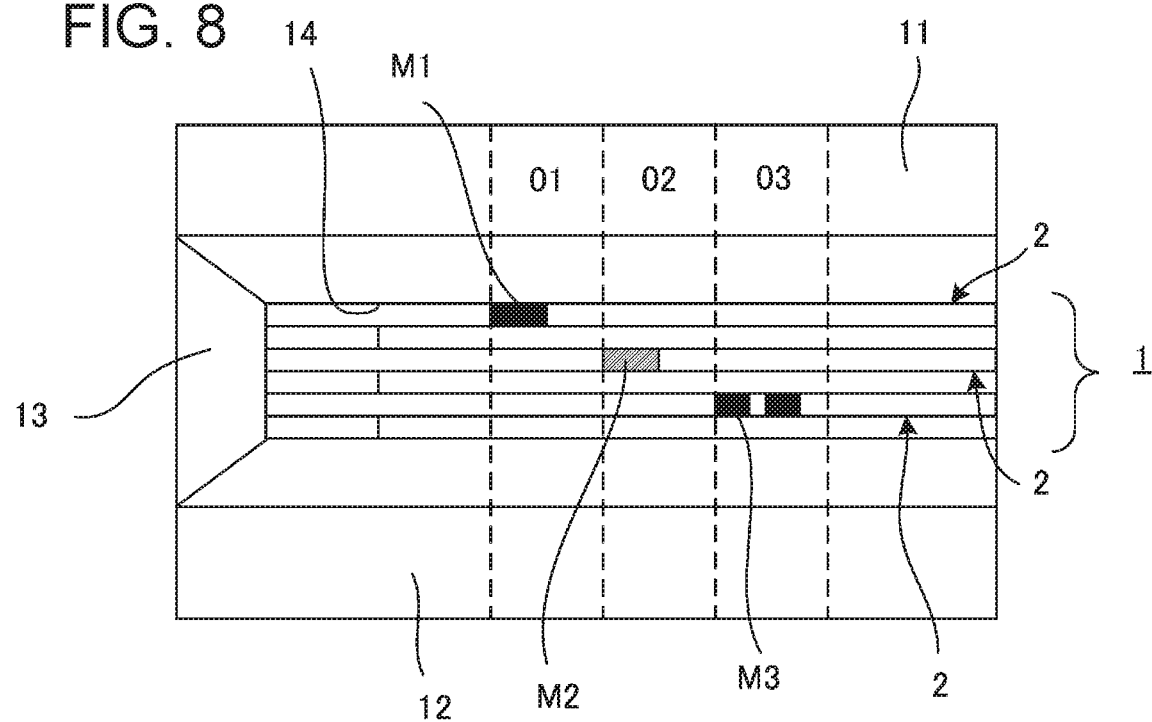

FLAT HARNESS

CROSS REFERENCE TO RELATED APPLICATIONS

This application is based on Japanese Patent Application (No. 2019-114882) filed on Jun. 20, 2019, the contents of which are incorporated herein by reference.

BACKGROUND OF THE INVENTION

1. Field of the Invention

The present invention relates to a flat harness configured by laminating a plurality of flat circuit bodies.

2. Description of the Related Art

Conventionally, identification of a flat circuit body is performed by printing a number or the like on a plane of the flat circuit body (JP-A-H05-242746). However, when a plurality of flat circuit bodies are stacked to form a flat harness, there is a problem in that it is difficult to confirm what type of flat circuit body is stacked in what order without seeing the printing of the flat circuit body other than the top.

There has been proposed that a flat circuit body has a tab protruding in a width direction thereof, and an identifier is provided on the tab (JP-A-H07-176216 and JP-UM-A-H06-23123). However, in a case where several flat circuit bodies of the same type are stacked, in order to prevent the tab from overlapping, it is necessary to prepare the same type of the flat circuit bodies with different tab positions, resulting in a problem of cost.

SUMMARY OF THE INVENTION

The present invention has been made in view of the above-described circumstances, and an object thereof is to provide a flat harness that can easily identify a flat circuit body at low cost.

In order to achieve the above object, the flat harness according to the present invention is characterized by the following items [1] to [6].
[1] There is provided a flat harness including:
  a plurality of flat circuit bodies that are stacked to each other,
  in which a mark is provided on a side surface of each of the plurality of flat circuit bodies; and
  in which a position of the mark in a length direction of the flat circuit body is provided so as to be different for each type of the flat circuit body.
[2] In the flat harness according to the item [1], the mark is provided by coloring.
[3] In the flat harness according to the item [2], a color or a shape of the mark is different for each type of the flat circuit body.
[4] In the flat harness according to any one of the items [1] to [3], a distance in the length direction of the flat circuit body from a reference position of the flat circuit body to the position of the mark is different for each type of the flat circuit body.
[5] In the flat harness according to the item [4], each of the plurality of flat circuit bodies has a bent portion formed by bending and overlapping a part of the corresponding flat circuit body, and the bent portion is the reference position.
[6] In the flat harness according to the items [4] or [5], the plurality of flat circuit bodies are stacked so that distances from the reference positions to the positions of the marks in the plurality of flat circuit bodies increase toward one side in a stacked direction of the plurality of flat circuit bodies.

According to the flat harness of the above configuration of the item [1], the mark is provided on the side surface of each of the flat circuit bodies. In addition, the position of the mark in the length direction of the flat circuit body is provided so as to be different for each type of the flat circuit body. As a result, the flat circuit body can be identified by the position of the mark in the length direction. Therefore, the flat circuit body can be easily identified at low cost.

According to the flat harness having the above configuration of the item [2], the mark is provided by coloring. Accordingly, the mark can be easily provided. In addition, since the position of the mark in the length direction is different for each type of flat circuit body, the flat circuit body can be easily identified even if the mark is provided by coloring on a portion having a small area such as a side surface.

According to the flat harness having the above configuration of the item [3], the color or shape of the mark is different for each type of the flat circuit body. As a result, the identification of the flat circuit body can be further facilitated.

According to the flat harness having the above configuration of the item [4], the distance in the length direction from the reference position to the mark is different for each type of the flat circuit body provided with the mark. Therefore, the identification of the flat circuit body can be further facilitated.

According to the flat harness having the above configuration of the item [5], the mark is provided with the bent portion as the reference position. As a result, the identification of the flat circuit body can be further facilitated.

According to the flat harness having the above configuration of the item [6], the distances of the plurality of flat circuit bodies from the reference positions to the marks become longer as the arrangement positions go toward one side in the lamination direction. As a result, it is possible to easily recognize whether or not there is an error in the lamination of the flat circuit body.

According to the present invention, it is possible to provide the flat harness that can easily identify a flat circuit body at low cost without increasing a width.

The present invention has been briefly described above. Further, details of the present invention will be clarified by reading a mode (hereinafter, referred to as an "embodiment".) for carrying out the invention to be described below with reference to the accompanying drawings.

BRIEF DESCRIPTION OF THE DRAWINGS

FIG. 8 is an example of a top view when the flat harness is inserted into the identification jig shown in FIG. 5.

DETAILED DESCRIPTION OF THE EXEMPLARY EMBODIMENTS

A specific embodiment of the present invention will be described below with reference to the drawings.

A flat harness 1 of the present embodiment shown in FIGS. 1 to 4 is an electric wire for explaining electric components mounted on a vehicle, for example. A connector is connected to an end portion of the flat harness 1, and the electrical components are connected to each other by connecting the connector to a mating connector of the electrical component.

Figure 1:
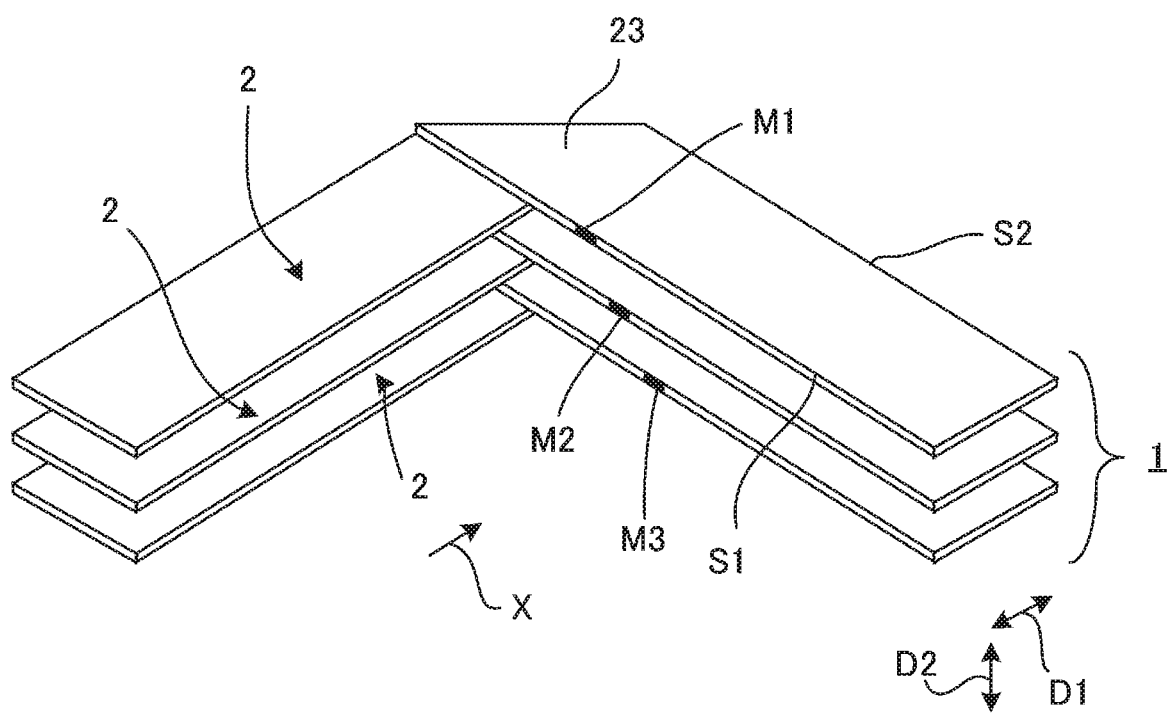
FIG. 1 is a perspective view of a flat harness according to the present invention.
Figure 2:
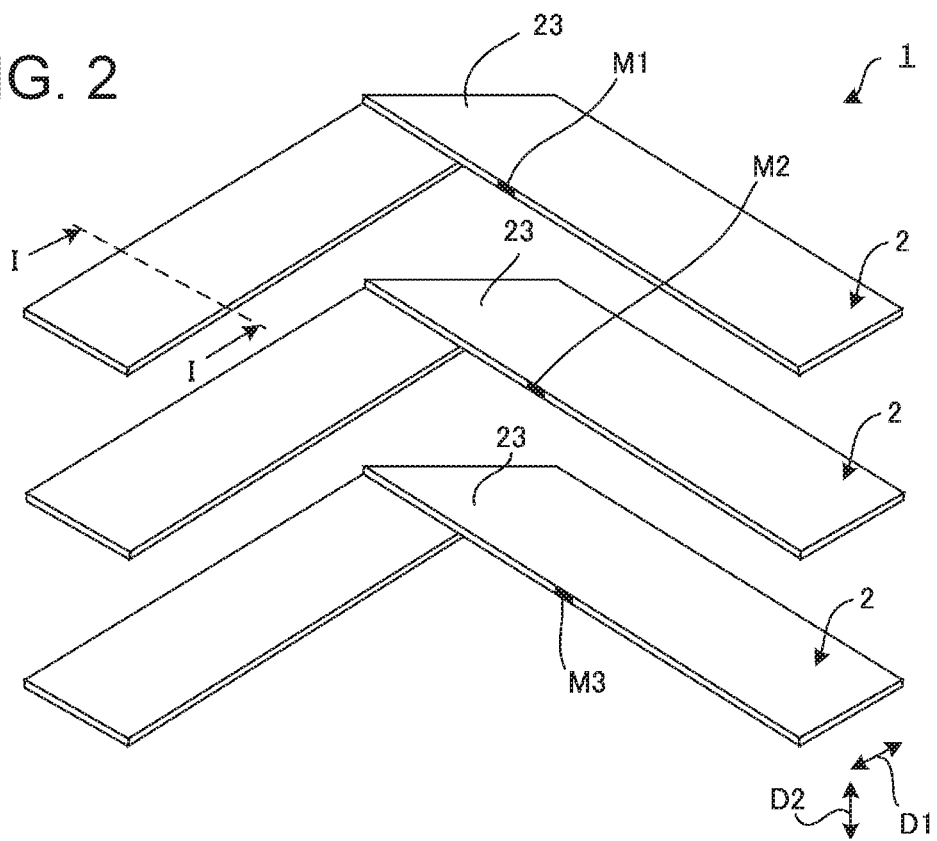
FIG. 2 is an exploded perspective view of the flat harness shown in FIG. 1.
Figure 3:
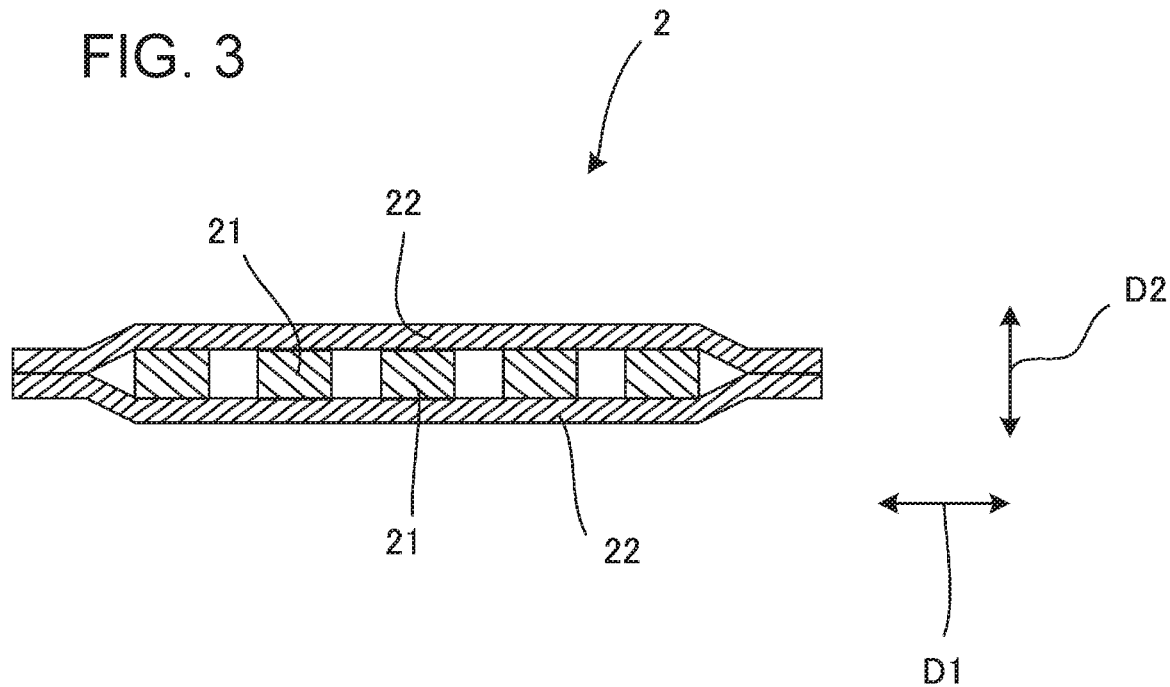
FIG. 3 is a sectional view taken along a line I-I of FIG. 2.

As shown in FIGS. 1 and 2, in the present embodiment, the flat harness 1 is configured by laminating a plurality of (for example, three) flat circuit bodies 2. The plurality of flat circuit bodies 2 are each provided in a long sheet shape, and have substantially the same width. As shown in FIG. 3, each of the flat circuit bodies 2 includes conductive portions 21 and a pair of insulating covering portions 22, 22 that cover both surfaces of each conductive portion 21.

The conductive portions 21 are each provided in a long sheet shape, and the plurality of conductive portions 21 are arranged side by side at intervals in a width direction D1. The pair of insulating covering portions 22, 22 is also provided in a long sheet shape, and covers the plurality of conductive portions 21 with both sides thereof sandwiched in a thickness direction D2. In an example shown in FIG. 3, the plurality of conductive portions 21 are provided, but the present invention is not limited thereto, and one conductive portion 21 may be provided.

As shown in FIG. 1, the flat harness 1 is configured by laminating the plurality of flat circuit bodies 2 in the thickness direction D2 (=a lamination direction). In addition, the flat harness 1 is formed to have a desired harness shape and be guided to a mating connector of an electrical component by appropriately providing a bent portion 23 in which a plane of each flat circuit body 2 is partially overlapped and bent. The plane of the flat circuit body 2 described above is a surface facing the thickness direction D2 of the flat circuit body 2. In the present embodiment, each of the flat circuit bodies 2 is provided with the bent portion 23 bent at approximately 90 degrees, and as shown in FIG. 4, the bent portions 23 are also stacked in the thickness direction D2.

Figure 4:
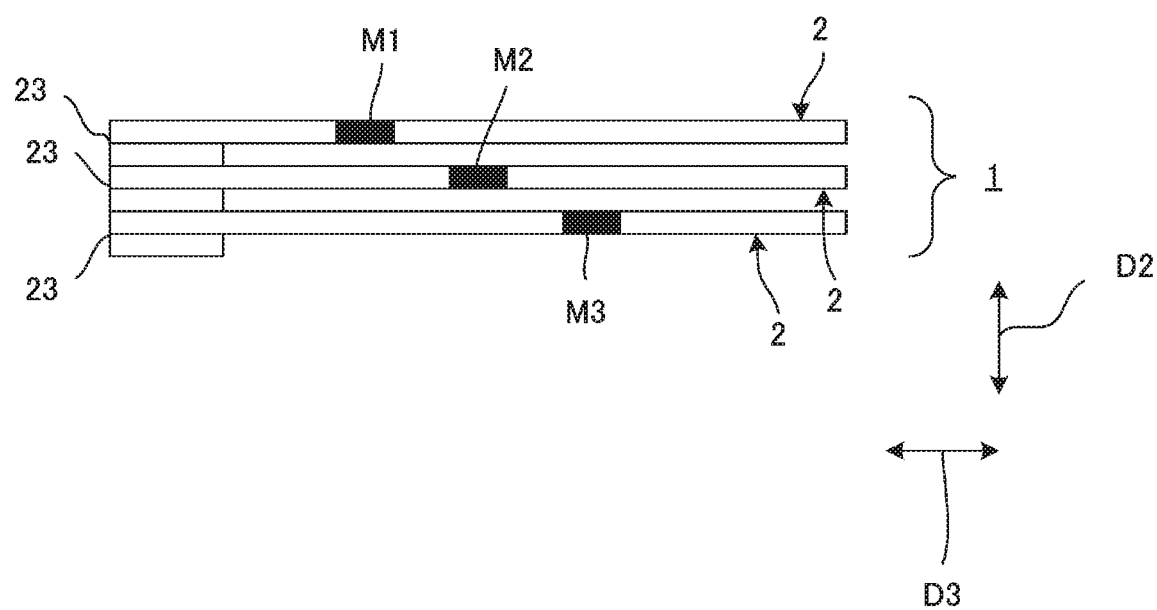
FIG. 4 is an X arrow view of the flat harness of FIG. 1.

As shown in FIG. 4, the flat circuit bodies 2 described above are respectively provided with markings M1 to M3 on one side surface S1 of a pair of side surfaces S1, S2 (FIG. 1) opposite to each other in the width direction D. The markings M1 to M3 are for identifying the flat circuit bodies 2, and are provided by applying ink or the like and coloring. In addition, the markings M1 to M3 are provided in a vicinity of the bent portions 23 in the side surface S1. Further, distances of the flat circuit bodies 2 in a length direction D3 from the respective bent portions 23 (a reference position) to the markings M1 to M3 are provided to be different for each type of the flat circuit bodies 2 provided with the markings M1 to M3. Incidentally, the type of the flat circuit body 2 is classified according to a form of the flat circuit body 2 (for example, the number of conductive portions 21) and a shape (a different length, or the like) of the flat circuit body 2.

In the present embodiment, the marking M1 provided on the flat circuit body 2 stacked on the top in FIG. 4 is provided such that the distance from the bent portion 23 is shortest. The marking M2 provided on the flat circuit body 2 stacked in the middle is provided such that the distance from the bent portion 23 is second shortest. The marking M3 provided on the flat circuit body 2 stacked at the bottom is provided such that the distance from the bent portion 23 is the longest. That is, in the plurality of flat circuit bodies 2, the distances from the bent portions 23 to the markings M1 to M3 become longer as arrangement positions of the markings go downward (one side) in the thickness direction D2.

According to the flat harness 1 described above, the markings M1 to M3 are provided on the side surfaces S1 of the flat circuit bodies 2. In addition, the distances from the respective bent portions 23 to the markings M1 to M3 are different for each type of the flat circuit bodies 2. In other words, positions of the markings M1 to M3 in the length direction D3 are different for each type of the flat circuit bodies 2. Accordingly, the flat circuit body 2 can be identified by the positions of the markings M1 to M3 in the length direction D3 (the distances from the respective bent portions 23 to the markings M1 to M3). Therefore, the flat circuit body 2 can be easily identified at low cost.

According to the flat harness 1 described above, the markings M1 to M3 are provided by coloring. Accordingly, the markings M1 to M3 can be easily provided. In addition, since the distances from the respective bent portions 23 to the markings M1 to M3 are different for each type of the flat circuit bodies 2, even if the markings M1 to M3 are each provided by coloring on a portion having a small area such as the side surface S1, the flat circuit body 2 can be easily identified.

Figure 5:
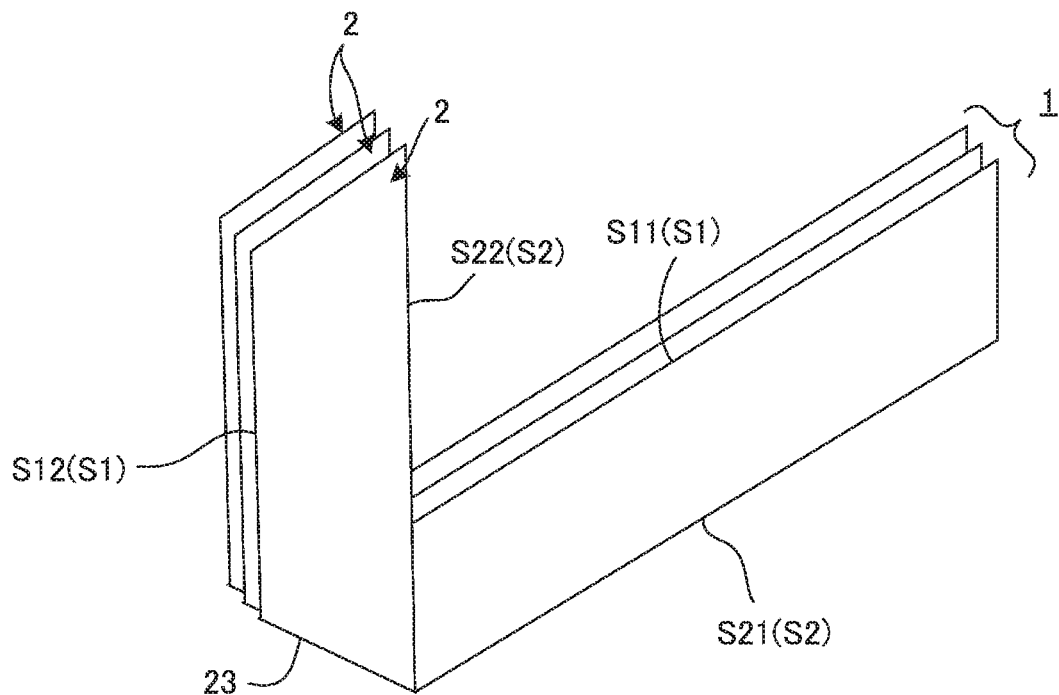
FIG. 5 is a perspective view of the flat harness shown in FIG. 1 and an identification jig for identifying a flat circuit body forming the flat harness.
Figure 5:
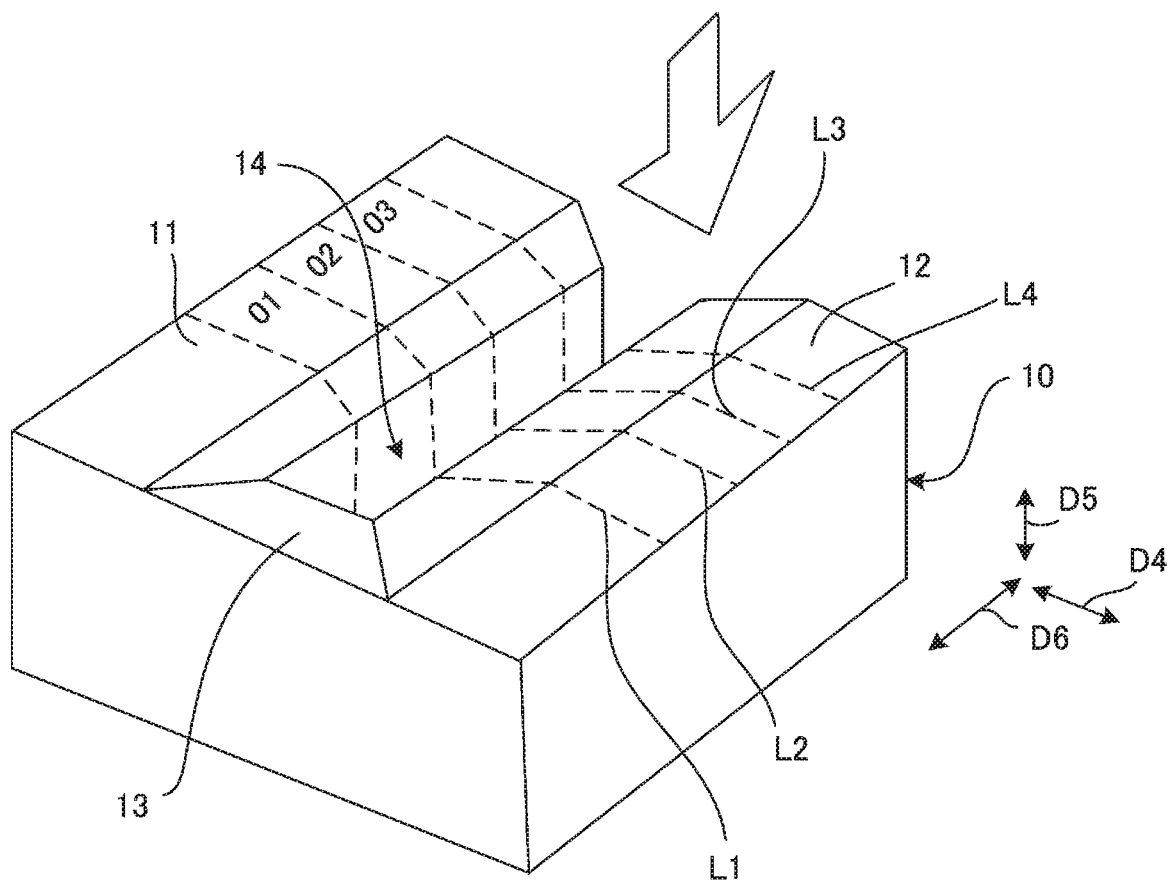

In the flat harness 1 described above, it is possible to identify the flat circuit body 2 and to easily determine whether or not there is an error in a laminating order of the flat circuit body 2 only by visually recognizing the side surface S1 as described above. However, as shown in FIG. 5, it is possible to more easily identify the flat circuit body 2 and determine whether or not there is an error in the laminating order using an identification jig 10.

In the flat harness 1 described above, in the plurality of flat circuit bodies 2, the distances from the bent portions 23 to the markings M1 to M3 become longer as the arrangement positions go downward in the thickness direction D2. As a result, it is possible to easily recognize whether or not there is an error in the lamination of the flat circuit body 2.

The identification of the flat circuit body 2 using the identification jig 10 will be described. Hereinafter, as shown in FIG. 5, in the flat circuit bodies 2, sides of the side surfaces S1 on which the markings M1 to M3 are provided with the respective bent portions 23 interposed therebetween are described as side surface portions S11, and sides of the side surfaces S1 on which the markings M1 to M3 are not provided are described as side surface portions S12. In addition, a portion of the side surface S2 facing the side surface portion S11 in the width direction D1 is referred to as a side surface portion S21, and a portion of the side surface S2 facing the side surface portion S12 in the width direction D1 is referred to as a side surface portion S22.

The identification jig 10 is provided in a substantially cubic shape, includes a bottom wall (not shown) and three side walls 11 to 13 erecting from the bottom wall, and has an elongated groove portion 14 formed therein. A periphery of the bent portion 23 of the flat harness 1 is inserted into the groove portion 14. The side walls 11, 12 are spaced apart from each other in a width direction D4 of the groove portion 14 and form the groove portion 14 therebetween. One side (a lower side in the figure) of the groove portion 14 in a depth direction D5 is closed by the bottom wall (not shown), and another side (an upper side in the figure) of the groove portion 14 in the depth direction D5 is opened. In addition, one side (a right side in the figure) of the groove 14 in a longitudinal direction D6 is opened, and another side (a left side in the figure) of the longitudinal direction D6 is closed by the side wall 13.

The operator inserts the periphery of the bent portion 23 of the flat harness 1 into the groove portion 14 so that the side surface portion S21 of the flat circuit body 2 abuts against the bottom wall (not shown) of the identification jig 10 and the side surface portion S12 abuts against the side wall 13. When the flat harness 1 is inserted into the groove portion 14 of the identification jig 10 in this manner, as shown in FIGS. 6 and 7, the markings M1 to M3 provided on the side surface portions S11 of the flat circuit bodies 2 can be visually recognized from an upper opening of the groove portion 14.

As shown in FIG. 5, dotted lines L1 to L4 indicating ranges of the markings M1 to M3 provided on the flat circuit bodies 2 are formed side by side in the longitudinal direction D6 on upper surface and inner surfaces of the side walls 11, 12 by printing or the like. In the present embodiment, an area between the dotted line L1 and the dotted line L2 indicate the range of the marking M1, an area between the dotted line L2 and the dotted line L3 indicate the range of the marking M2, and an area between the dotted line L3 and the dotted line L4 indicate the range of the marking M3. In addition, on the upper surface of the side wall 11, a number "01" indicating the laminating order of the flat circuit body 2 in which the marking M1 is formed between the dotted lines L1, L2 is formed by printing or the like. A number "02" indicating the laminating order of the flat circuit body 2 in which the marking M2 is formed between the dotted lines L2, L3 is formed. A number "03" indicating the laminating order of the flat circuit body 2 in which the marking M3 is formed between the dotted lines L4, L5 is formed.

Figure 6:
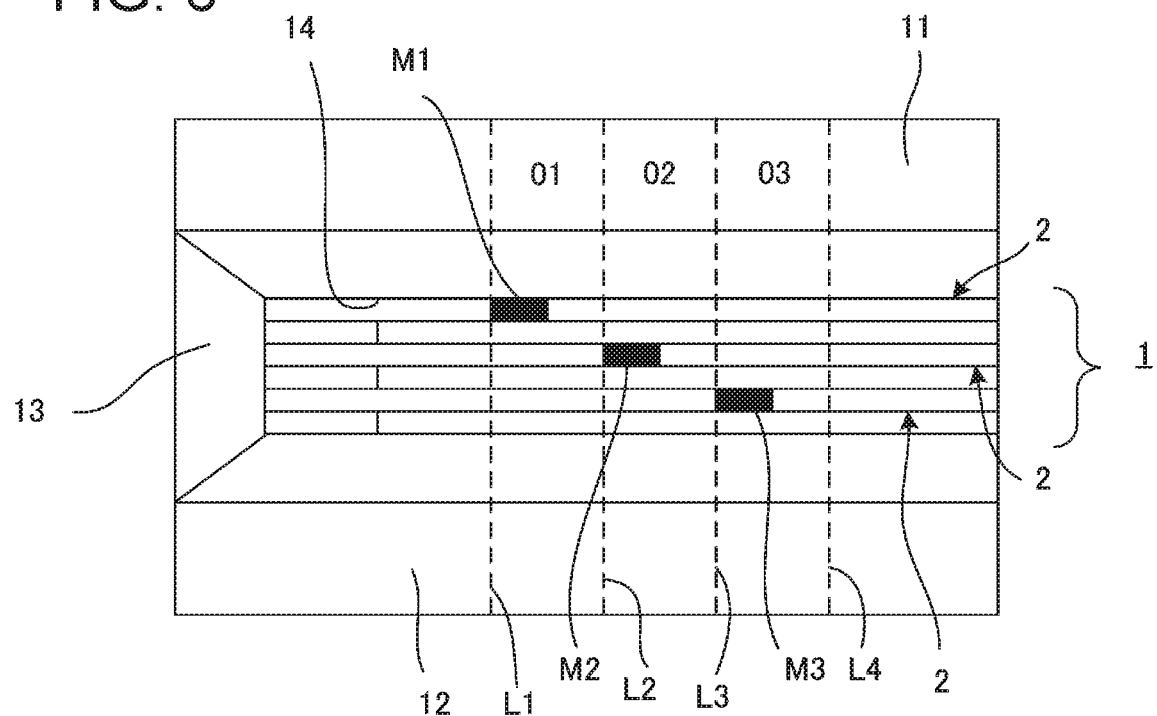
FIG. 6 is an example of a top view when the flat harness is inserted into the identification jig shown in FIG. 5.

As a result, as shown in FIG. 6, if the flat circuit body 2 in which the marking M1 is formed within the range of the dotted lines L1 and the dotted line L2 is positioned at the top, the flat circuit body 2 in which the marking M2 is formed within the range of the dotted line L2 and the dotted line L3 is positioned in the middle, and the flat circuit body 2 in which the marking M3 is formed within the range of the dotted line L3 and the dotted line L4 is positioned at the bottom, it is possible to visually easily determine that there is no error in the laminating order of the flat circuit body 2.

Figure 7:
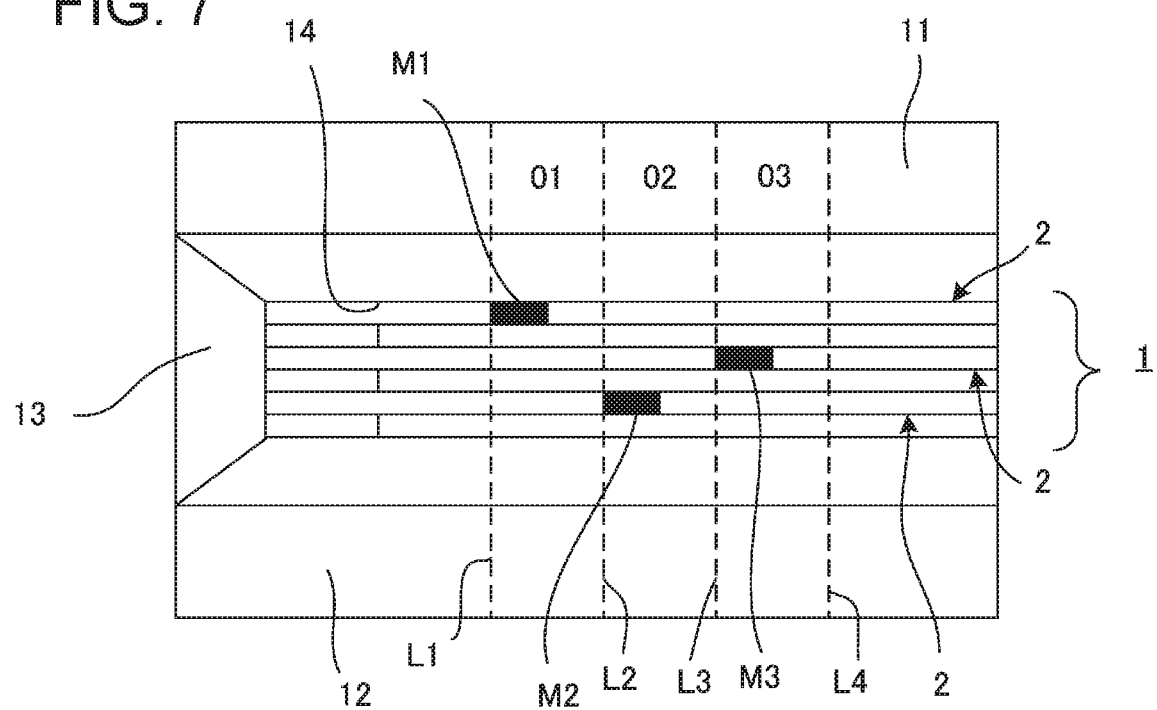
FIG. 7 is an example of a top view when the flat harness is inserted into the identification jig shown in FIG. 5.

On the other hand, as shown in FIG. 7, if the flat circuit body 2 in which the marking M2 is formed within the range of the dotted line L2 to the dotted line L3 is not positioned in the middle, and the flat circuit body 2 in which the marking M3 is formed within the range of the dotted line L3 to the dotted line L4 is not positioned at the bottom, it is possible to visually easily determine that there is an error in the laminating order of the flat circuit body 2.

According to the embodiment described above, since the markings M1 to M3 are respectively provided on the flat circuit bodies 2 with the bent portions 23 as the reference positions, each of the flat circuit bodies 2 can be identified more easily using the identification jig 10 as shown in FIG. 5.

The present invention is not limited to the embodiment described above, and may be appropriately modified, improved, or the like. In addition, materials, shapes, dimensions, numbers, arrangement positions or the like of elements in the embodiment described above are optional and not limited as long as the present invention can be achieved.

According to the embodiment described above, the distances between the respective bent portions 23 and the markings M1 to M3 are different for each type of the flat circuit bodies 2, but the present invention is not limited thereto. The colors and shapes of the markings M1 to M3 may be different depending on the type of the flat circuit bodies 2. In this case, the colors of the markings M1 to M3 may be different for each form of the flat circuit bodies 2, and the shapes of the markings M1 to M3 may be different for each shape (the different lengths, or the like) of the flat circuit bodies 2. In an example shown in FIG. 8, the markings M1, M3 having the same color and different shapes are respectively provided in the uppermost flat circuit body 2 and the lowermost flat circuit body 2, and it can be seen at a glance that the markings M1, M3 are of the same form but have different shapes.

According to the embodiment described above, the correct laminating order of the flat circuit body 2 is shown in FIG. 6, but the present invention is not limited thereto. Depending on a product, what is shown in FIG. 7 may be the correct laminating order of the flat circuit body 2. In this case, the laminating order may be determined using the identification jig 10 on which the positions of the numbers "02" and "03" are changed.

According to the embodiment described above, the reference position of the flat circuit body 2 is the bent portion 23, but the present invention is not limited thereto. As the reference position, an end portion of the flat circuit body 2 may be set as the reference position.

According to the embodiment described above, a mark (the markings M1 to M3) provided on the side surface S1 of the flat circuit body 2 is provided by coloring, but the present invention is not limited thereto. The mark may be provided by cutting out the side surface S1 or by protruding a tab.

What is claimed is:
1. A flat harness comprising:
a plurality of flat circuit bodies that are stacked to each other in a thickness direction,
wherein a mark is provided on a side surface of each of the plurality of flat circuit bodies and extends in the thickness direction; and
wherein a position of the mark in a length direction of each of the plurality of flat circuit bodies is provided so as to be different for each type of the plurality of flat circuit bodies;
wherein a distance in the length direction of each of the plurality of flat circuit bodies from a reference position of each of the plurality of flat circuit bodies to the position of the mark is different for each type of the plurality of flat circuit bodies;
wherein each of the plurality of flat circuit bodies has a bent portion formed by bending and overlapping a part of each of the plurality of flat circuit bodies;
wherein the bent portion is the reference position; and
wherein when the plurality of flat circuit bodies are stacked to each other in the thickness direction, the reference positions of the plurality of flat circuit bodies are aligned along the thickness direction.
2. The flat harness according to claim 1, wherein the mark is provided by coloring.
3. The flat harness according to claim 2, wherein a color or a shape of the mark is different for each type of the plurality of flat circuit bodies.
4. The flat harness according to claim 1, wherein the plurality of flat circuit bodies are stacked so that distances from the reference positions to the positions of the marks in the plurality of flat circuit bodies increase toward one side in the thickness direction of the plurality of flat circuit bodies.

5. The flat harness according to claim 1, wherein the mark is provided directly on the side surface of each of the plurality of flat circuit bodies.

6. The flat harness according to claim 1, wherein the side surface of each of the plurality of flat circuit bodies is flush with the side surface of each other of the plurality of flat circuit bodies in a width direction.

7. The flat harness according to claim 1, wherein the mark is a uniform symbol on the side surface of each of the plurality of flat circuit bodies.

8. The flat harness according to claim 1, wherein the side surface of each of the plurality of flat circuit bodies extends perpendicular to a width direction.

* * * * *